United States Patent
Cioaca

(10) Patent No.: US 6,949,953 B2
(45) Date of Patent: Sep. 27, 2005

(54) METHOD AND APPARATUS FOR PROVIDING A PRESELECTED VOLTAGE TO TEST OR REPAIR A SEMICONDUCTOR DEVICE

(75) Inventor: Dumitru Cioaca, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 617 days.

(21) Appl. No.: 10/166,192

(22) Filed: Jun. 10, 2002

(65) Prior Publication Data

US 2003/0229832 A1 Dec. 11, 2003

(51) Int. Cl.⁷ .............................................. H03K 19/094
(52) U.S. Cl. ..................... 326/88; 327/536; 365/189.09
(58) Field of Search .............. 326/16, 82–92; 365/189.09; 327/536, 537

(56) References Cited

U.S. PATENT DOCUMENTS

| | | | | |
|---|---|---|---|---|
| 5,414,669 A | * | 5/1995 | Tedrow et al. | 365/226 |
| 5,455,794 A | * | 10/1995 | Javanifard et al. | 365/185.18 |
| 6,297,687 B1 | * | 10/2001 | Sugimura | 327/536 |

* cited by examiner

*Primary Examiner*—Don Le
(74) *Attorney, Agent, or Firm*—Williams, Morgan & Amerson

(57) ABSTRACT

A method and apparatus for providing a preselected voltage to test or repair a semiconductor device. The apparatus includes a one-stage pump and a transfer device. The one-stage pump is adapted to access a first voltage and provide a second voltage using the first voltage. The transfer device is capable of providing the first voltage to a node using the second voltage.

41 Claims, 11 Drawing Sheets

METHOD AND APPARATUS FOR PROVIDING A PRESELECTED VOLTAGE TO TEST OR REPAIR A SEMICONDUCTOR DEVICE

BACKGROUND OF THE INVENTION

1. Field of the Invention

This invention relates generally to a semiconductor device, and, more particularly, to providing a preselected voltage to test or repair the semiconductor device.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly, electrically conductive lines/traces may also be formed in the semiconductor substrate. Generally, the lines/traces electrically connect selected semiconductor devices to form circuits capable of performing complex functions. For example, data may be stored in a semiconductor memory device by providing electrical current to a plurality of bit lines and a plurality of word lines that may be electrically coupled to one or more capacitors in the semiconductor memory. In at least some applications, a large number of lines/traces may be required, such that they, too, may be relatively densely packed.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information out of the semiconductor memory. In many cases, the array of memory cells will be subdivided into several sub-arrays, or subsets of the complete collection of memory cells. For example, a semiconductor memory having 16 megabits ($2^{24}$ bits) of storage capacity, may be divided into 64 sub-arrays, each having 256K ($2^{18}$) memory cells.

Although forming the selected electrical connections may enable the circuits to perform their intended functions, undesirable electrical connections may result in a variety of malfunctions, e.g., short circuit paths may be established. Thus, semiconductor devices such as the capacitors in memory cells and conducting lines such as the input/output lines may generally be electrically isolated. For example, to insure that devices, lines, and/or groups thereof that may form the semiconductor memory are properly isolated, modern semiconductor processing involves the formation of shallow trench isolations (STI) in various regions of the substrate. These shallow trench isolations are typically formed by etching a trench in the semiconductor substrate and, thereafter, filling the trench with an isolation material, e.g., an insulator, such as silicon dioxide, silicon oxynitride, silicon nitride, or other like materials.

However, it may be difficult to completely isolate the devices and/or lines. For example, defects in the semiconductor substrate or in the manufacturing process may form an undesirable conducting path, sometimes referred to as a "stringer," between the devices and/or lines in the semiconductor memory that may cause the semiconductor memory to malfunction. In one embodiment, a test voltage may be applied to the word lines and/or bit lines to determine how memory cells in the semiconductor memory perform under stress. For example, stringers may be detected and/or repaired by applying the test voltage to the semiconductor memory. But the semiconductor memory may not be able to provide a voltage that is high enough to enable the stringer to be detected and/or repaired. Thus, a margin mode circuit may be used to provide the test voltage.

Traditionally, the test voltage may be applied using a tester 100 that may be located on a semiconductor memory device 105, as shown in FIG. 1. The margin mode circuit in the tester 100 may include a multi-stage pump 110, a clock generator 115, an oscillator 120, and an enable logic 125 that may be used to facilitate the transfer of an external voltage from a memory pad 130 to a semiconductor memory array 140 via a transistor 145. The multi-stage pump 110, the clock generator 115, the oscillator 120, and the enable logic 125 may be coupled to a supply voltage 160 and a low voltage 165. For example, in one embodiment, the supply voltage 160 may be equal to 3 Volts and the low voltage 165 may be equal to ground, i.e. 0 Volts.

To transfer a voltage that is larger than the supply voltage 160 from the memory pad 130 to the semiconductor memory array 140, a gate of the transistor 145 may be coupled to the multi-stage pump 110, which may provide a voltage that may be used to forward bias the transistor 145. For example, if a voltage of 10 Volts is applied to the memory pad 130, the multi-stage pump 110 may provide a voltage equal to 10 Volts plus the threshold voltage of the transistor 145. A typical threshold voltage for the transistor 145 is about 1 Volt. To provide the voltage of about 11 Volts to the transistor 145 using the supply voltage 160, the multi-stage pump 110 may use 4 or 5 multiplying stages (not shown).

The tester 100 may suffer from numerous disadvantages. For example, the multi-stage pump 110 may occupy 4 to 5 times as much area as a single stage pump. The multi-stage pump 110 may also be incapable of providing a variety of voltages. For example, a multi-stage pump 110 that is designed to supply 11 Volts may be capable of supplying voltages ranging from 0 Volts to 10 Volts from the memory pad 130 to the semiconductor memory array 140 through the transistor 145. For another example, a multi-stage pump 110 that is designed to supply 11 Volts may not be capable of supplying about 12 Volts to the transistor 145. Thus, the multi-stage pump 110 may not be useful if the semiconductor memory array 140 may preferably be tested using a larger voltage of about 12 Volts.

For another example, the multi-stage pump 110 may be driven by the clock generator 115. Because the multi-stage pump 110 includes a plurality of multiplying stages, each of which must be driven by a signal from the clock generator 115, the clock generator 115 may be undesirably large and may occupy an undesirably large area of the semiconductor memory device 105. The clock generator 115 may also require a driving signal from the oscillator 120 that may be provided in response to a signal provided by the enable logic 125.

Furthermore, when the semiconductor memory array 140 is in deep-power-down status, the current in the semiconductor memory device 105 may be very low. However, if the multi-stage pump 110, the clock generator 115, the oscillator 120, and the enable logic 125 are coupled to pad 160, which may provide the supply voltage from an external source to the semiconductor memory array 140, the noise current in these components may be much larger than the current in the semiconductor memory array 140. In that case, it may not be possible to measure the current that may be in the semiconductor memory array 140 during the deep-power-down mode.

SUMMARY OF THE INVENTION

In one aspect of the instant invention, an apparatus is provided for providing a preselected voltage to test or repair a semiconductor device. The apparatus includes a one-stage pump and a transfer device. The one-stage pump is adapted to access a first voltage and provide a second voltage using the first voltage. The transfer device is capable of providing the first voltage to a node using the second voltage.

In one aspect of the present invention, a method is provided for providing a preselected voltage to test or repair a semiconductor device. The method includes accessing a first voltage, providing the first voltage to a one-stage pump, providing a second voltage to a first transfer device using the one-stage pump, and providing the first voltage to a node coupled to the first transfer device using the second voltage.

BRIEF DESCRIPTION OF THE DRAWINGS

The invention may be understood by reference to the following description taken in conjunction with the accompanying drawings, in which like reference numerals identify like elements, and in which.

Figure 1:
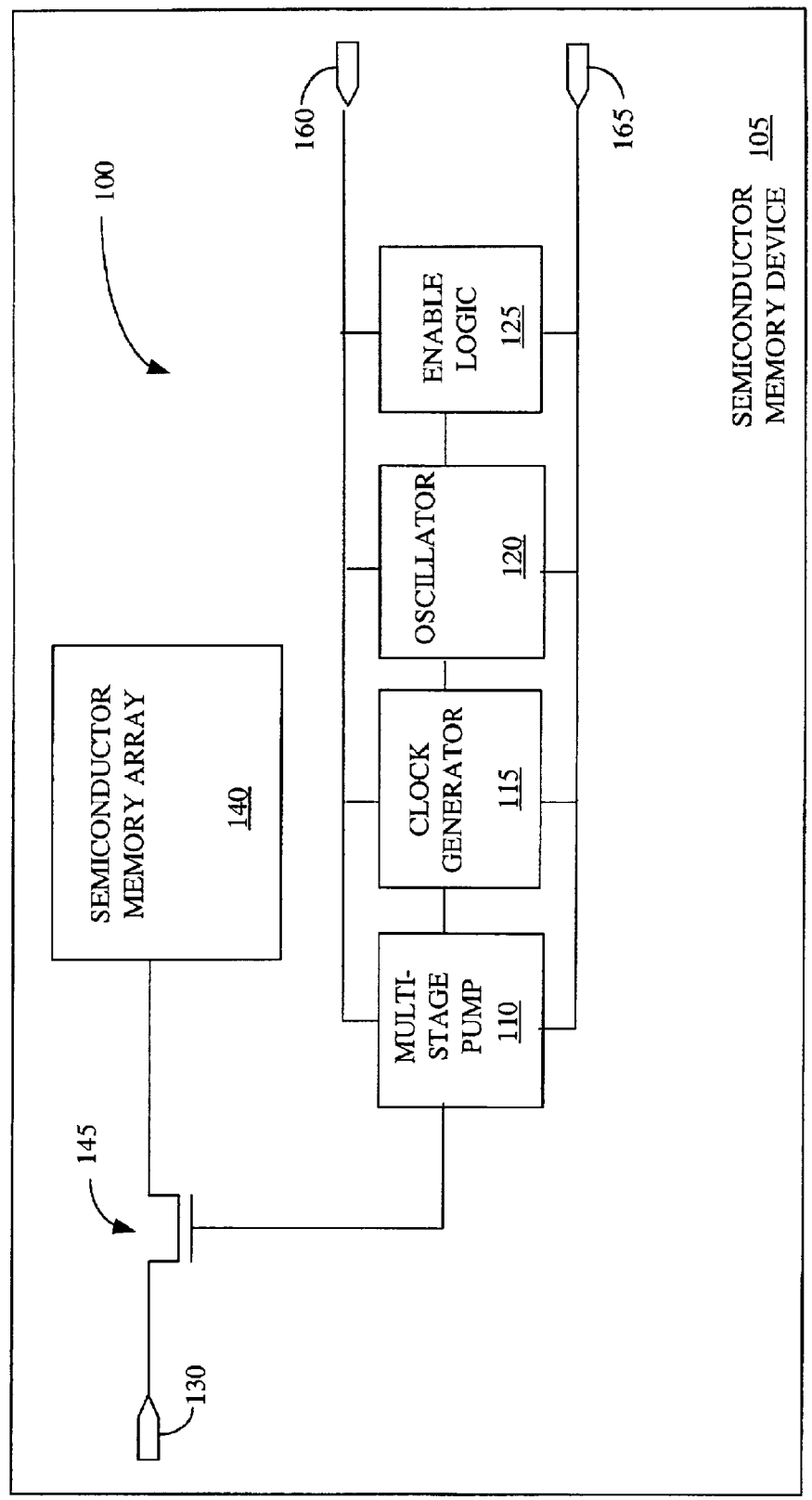
FIG. 1 shows a block diagram of a prior art tester.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
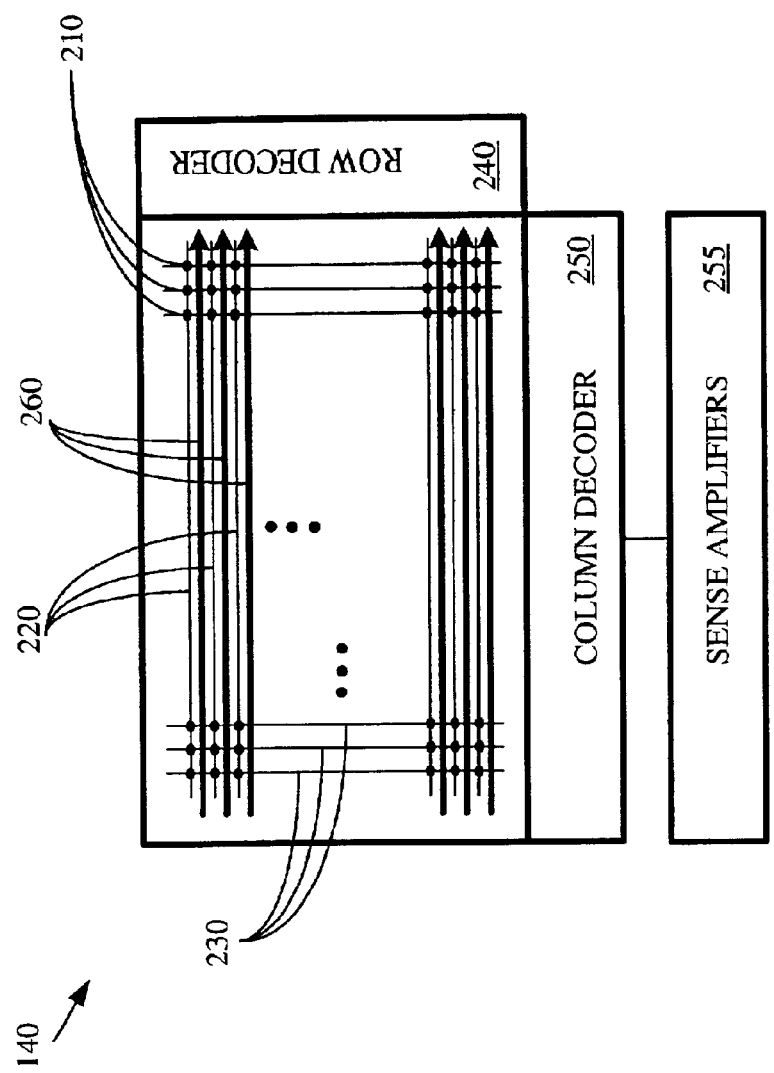
FIG. 2 illustrates an exemplary arrangement of a prior art semiconductor memory sub-array with row and column decoding and input/output lines.

Referring now to FIG. 2, an exemplary arrangement of a semiconductor memory array 140 is shown. The semiconductor memory array 140 includes a plurality of memory cells 210. For example, the semiconductor memory array 140 may include, in one embodiment, 256K ($2^{18}$) memory cells 210. The memory cells 210 may be coupled to a plurality of rows 220 and columns 230. For example, the semiconductor memory array 140 may include 512 ($2^9$) rows 220 and 512 columns 230. Each column 230 may be coupled to 512 memory cells 210, one memory cell 210 for each of the 512 rows 220.

A row decoder 240 may receive row address signals and, based on those signals, may activate a selected row 220 in the semiconductor memory array 140. A column decoder 250 may receive column address signals and, based on those signals, may select a particular column 230 in the semiconductor memory array 140. In one embodiment, the column decoder 250 may couple the particular column 230 to one or more sense amplifiers 255. The selection of the row 220 and the column 230 will result in the sensing of the logical state of the memory cell 210 located at the intersection of that row 220 and column 230. The signal representing the logical state of that memory cell 210 may then be coupled to a selected input/output line 260. The input/output lines 260 may, in one embodiment, traverse the semiconductor memory array 140 in a direction parallel to the rows 220 and perpendicular to the columns 230.

The components of the semiconductor memory array 140, such as the rows 220, columns 230, and memory cells 210, are generally electrically isolated from each other. Although not so limited, in one embodiment, the components may be electrically isolated from each other by forming shallow trench isolations (STI) in various regions of the substrate. It may, however, be difficult to completely isolate the devices (e.g. the memory cells 210) and/or lines 260, rows 220, and/or columns 230. For example, defects in the semiconductor substrate or in the manufacturing process may form an undesirable conducting path, hereinafter referred to as a "stringer," between the devices and/or lines 260, rows 220 and/or columns 230 in the semiconductor memory array 140 that may cause the semiconductor memory array 140 to malfunction. The stringers may be detected and, in certain instances, repaired by applying a selected voltage. Thus, in accordance with one embodiment of the present invention, the selected voltage may be provided to portions of the semiconductor memory array 140 by a pump and a transfer device (not shown).

Figure 3:
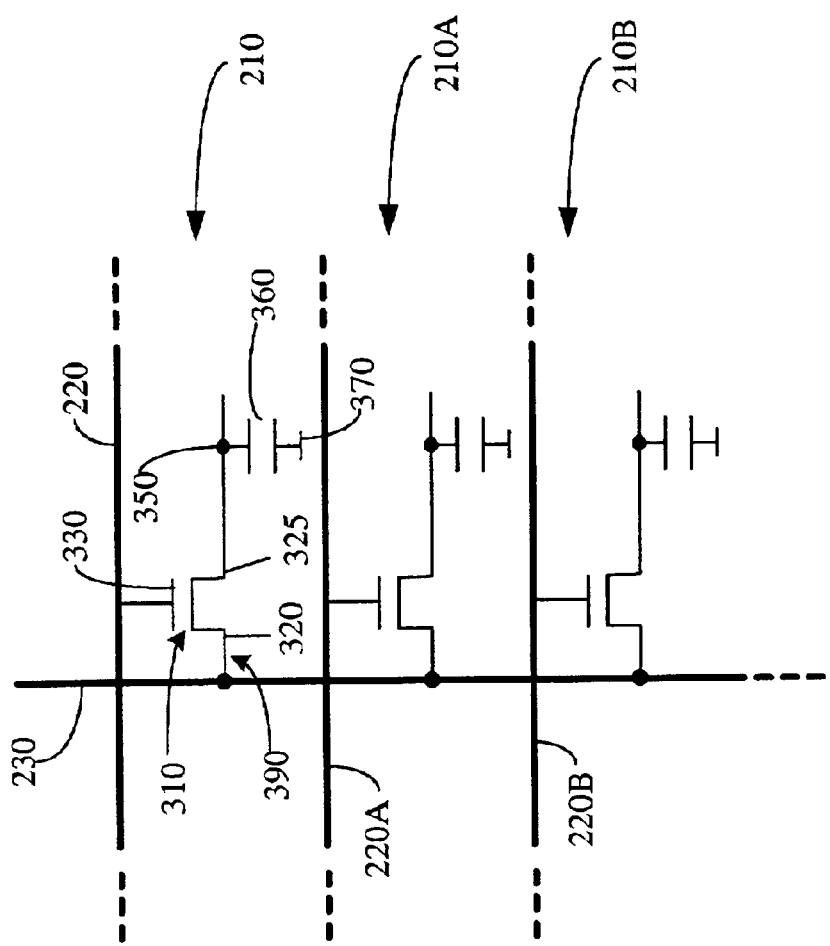
FIG. 3 shows a circuit diagram representing an exemplary prior art memory cell.

Referring now to FIG. 3, a circuit diagram representing an exemplary memory cell 210 is shown. In one embodiment, the memory cell 210 may be a dynamic random access memory (DRAM) cell. However, it should be appreciated that the present invention is not so limited. In alternative embodiments, the memory cell 210 may be a synchronous dynamic random access memory cell (SDRAM), a flash memory cell, and the like. In one embodiment, the memory cell 210 may include a transistor 310 having a source 320 and drain 325 connected in series between a column 230 and a storage node 350 of a storage capacitor 360. The storage capacitor 360 may be connected between the storage node 350 and a reference voltage 370. For example, the reference voltage 370 may be electrical ground.

The transistor 310 may also have a gate 330 that may be driven into conduction by a signal carried by the row 220 connected to the gate 330. Although the memory cells 210 described herein include one transistor 310 and one storage capacitor 360 coupled to the row 220 and the column 230, the present invention is not so limited. In alternative embodiments, the memory cell 210 may include any desirable number of transistors 310, storage capacitors 360, rows 220, columns 230, or other devices that may be connected in any desirable manner. In one embodiment, the transistors 310 may be N-channel MOS devices constructed to exhibit enhancement mode characteristics. Of course, those skilled in the art, having benefit of the present disclosure, may construct the memory cells 210 utilizing a different type of transistor 310 without departing from the scope of the present invention. Also, the storage capacitor 360 may be preferably of the semiconductor type which exhibits a high capacitance per unit of wafer area. However, the storage capacitor 360 may be constructed using any suitable technology, and the structure need not be a capacitor.

The operation of the DRAM memory cell 210 is described briefly as follows. In response to a read or write operation of the memory cell 210, an address to the semiconductor memory array 140 is decoded such that a row address signal on the row 220 is driven to a high logic level, wherein the transistor 310 is driven into conduction. With the transistor 310 in a conducting state, the storage capacitor 360 is coupled to the column 230 through the transistor 310, and data is read from or written to the memory cell 210. A sense amplifier and other appropriate circuitry (not shown) may be coupled to the column 230 to accomplish the appropriate read or write operation. At the completion of the read or write operation, the row 220 will resume a low logic level, and the transistor 310 will be turned off, again isolating the storage capacitor 360 of the memory cell 210 from the column 230. As is generally illustrated in FIG. 2, it is to be understood that a number of memory cells 210, 210A, 210B, etc. may be coupled to the column 230, as well as to a corresponding number of rows 220, 220A, 220B, etc.

Figure 4:
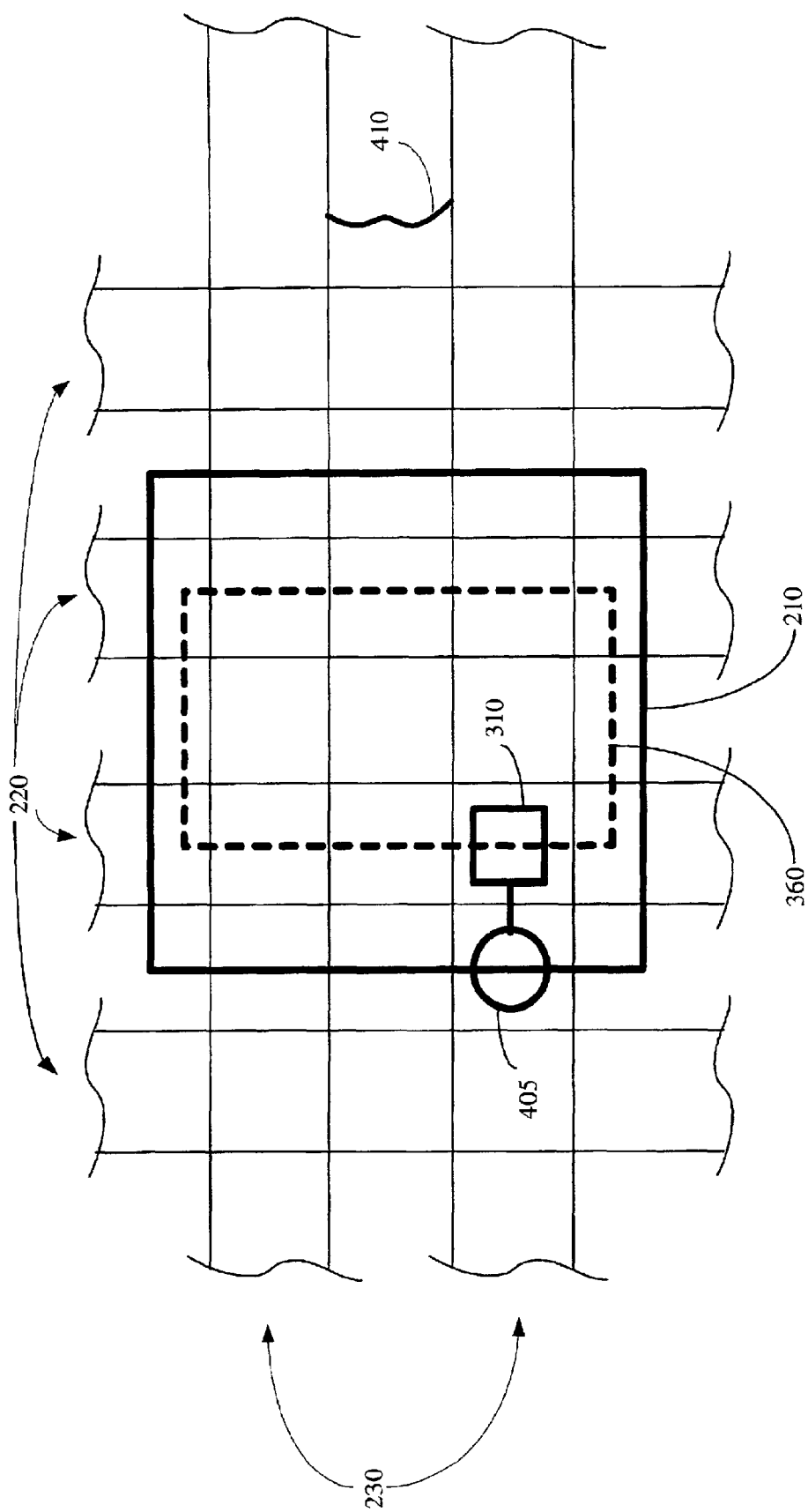
FIG. 4 shows a portion of one illustrative chip layout in which a memory cell such as that shown in FIG. 3 is employed, in accordance with one embodiment of the present invention.

Referring now to FIG. 4, a portion of one illustrative chip layout including the memory cell 210 is shown. The memory cell 210, indicated by a bold-line rectangle in FIG. 4, may include the storage capacitor 360, indicated in FIG. 4 by a dashed rectangle, which may be the storage element portion of the memory cell 210. The specific structure of the storage capacitor 360 may take a number of acceptable forms, including, for example, a stack structure, a comb structure, or other standard capacitor structure. A "capacitor over bitline" technology or a "bitline over capacitor" technology may be employed. In one embodiment, the memory cell 210 may be coupled to the column 230 at the node 405, which may be coupled to the source 320 (see FIG. 3) of the transistor 310. The storage capacitor 360 may be coupled to the drain 325 (see FIG. 3) of the transistor 310. The row 220 may be coupled to the gate 330 (see FIG. 3) of the transistor 310 such that when the row 220 is activated, the transistor 310 may couple the storage capacitor 360 of the memory cell 210 to the column 230.

However, the row 220, column 230, storage capacitor 360, and other components of the memory cell 210 may not be sufficiently electrically isolated. For example, defects in the semiconductor substrate or in the manufacturing process may form a stringer 410 between the columns 230 in the semiconductor memory array 140. The stringer 410 may cause a short circuit that may cause the semiconductor memory array 140 to malfunction. Although specific reference is made to the stringer 410 that may couple the columns 230, it should be appreciated that the following discussion may also apply to a variety of other undesirable features in the semiconductor device, such as stringers 410 that may couple the rows 220, and the like.

Figure 5:
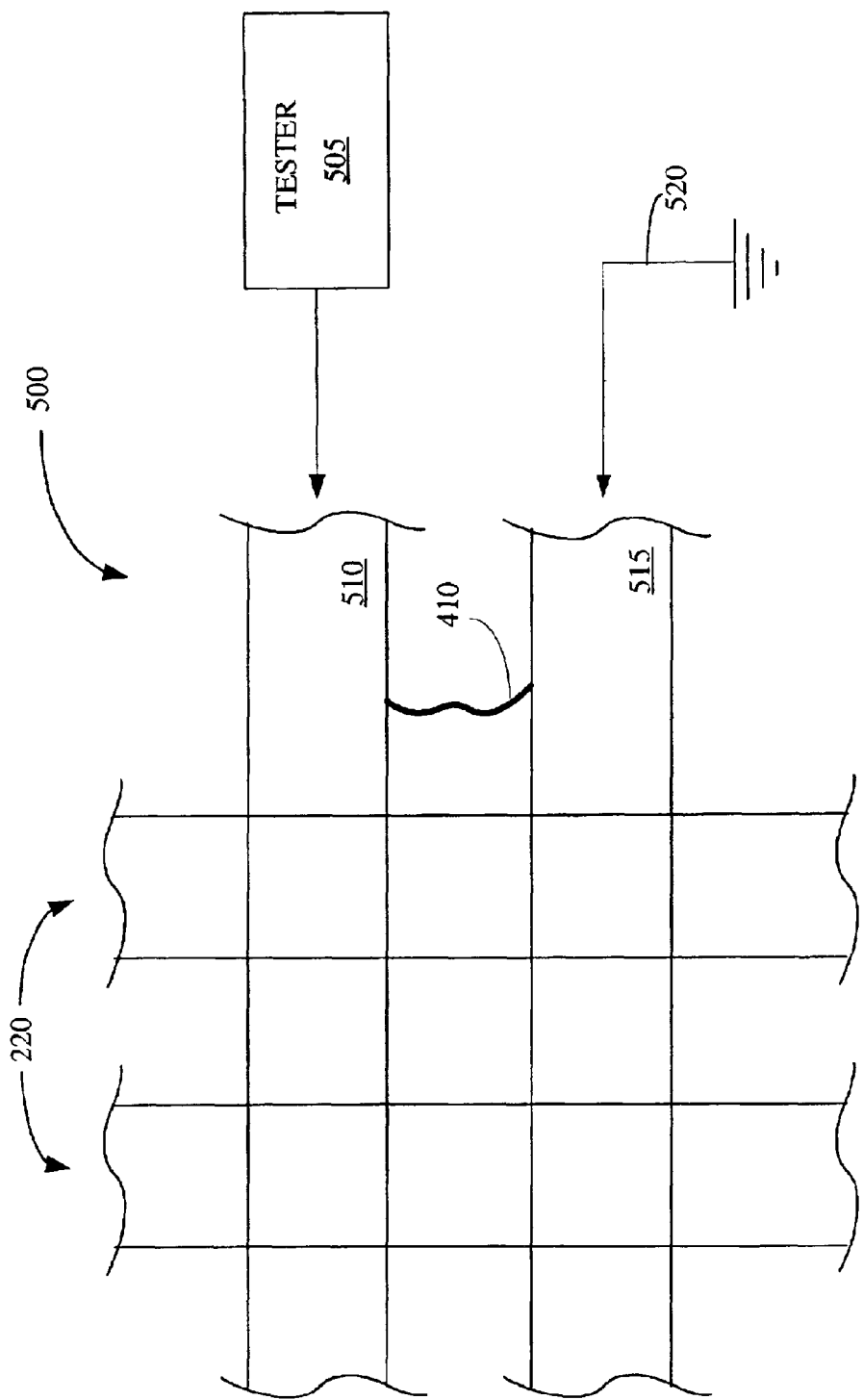
FIG. 5 shows a block diagram of a test circuit that may be used with the chip layout shown in FIG. 4, in accordance with one embodiment of the present invention.

FIG. 5 shows a test circuit 500 that may be used to detect and/or substantially repair the stringer 410. In one embodiment, a tester 505 may be coupled to a first row 510 and may apply a selected voltage to the first row 510. For example, the tester 505 may apply a voltage of 10 Volts to the first row 510. A second row 515 may be coupled to a reference voltage via a line 520. For example, the reference voltage may be electrical ground. If the first and second rows 510, 515 are substantially electrically isolated, then the tester 505 may not detect a short-circuit current.

If, however, the stringer 410 couples the first and second rows 510, 515, then the tester 505 may detect the short-circuit current that may be driven by the voltage difference between the applied voltage and the reference voltage. Although the test circuit 500 illustrated in FIG. 5 includes a first and second row 510, 515, it will be appreciated that, in alternative embodiments, more or fewer rows 510, 515 may be coupled to the tester 505 or to the reference voltage via the line 520. In addition, any other desirable component of the semiconductor memory array 140, such as the columns 220, may be coupled to the tester 505 or the reference voltage. In one embodiment, applying a sufficiently high voltage to the row 510 may substantially decouple the rows 510, 515. For example, applying a voltage of 10 Volts may be sufficient to substantially remove the stringer 410 and thus repair the short circuit.

Figure 6:
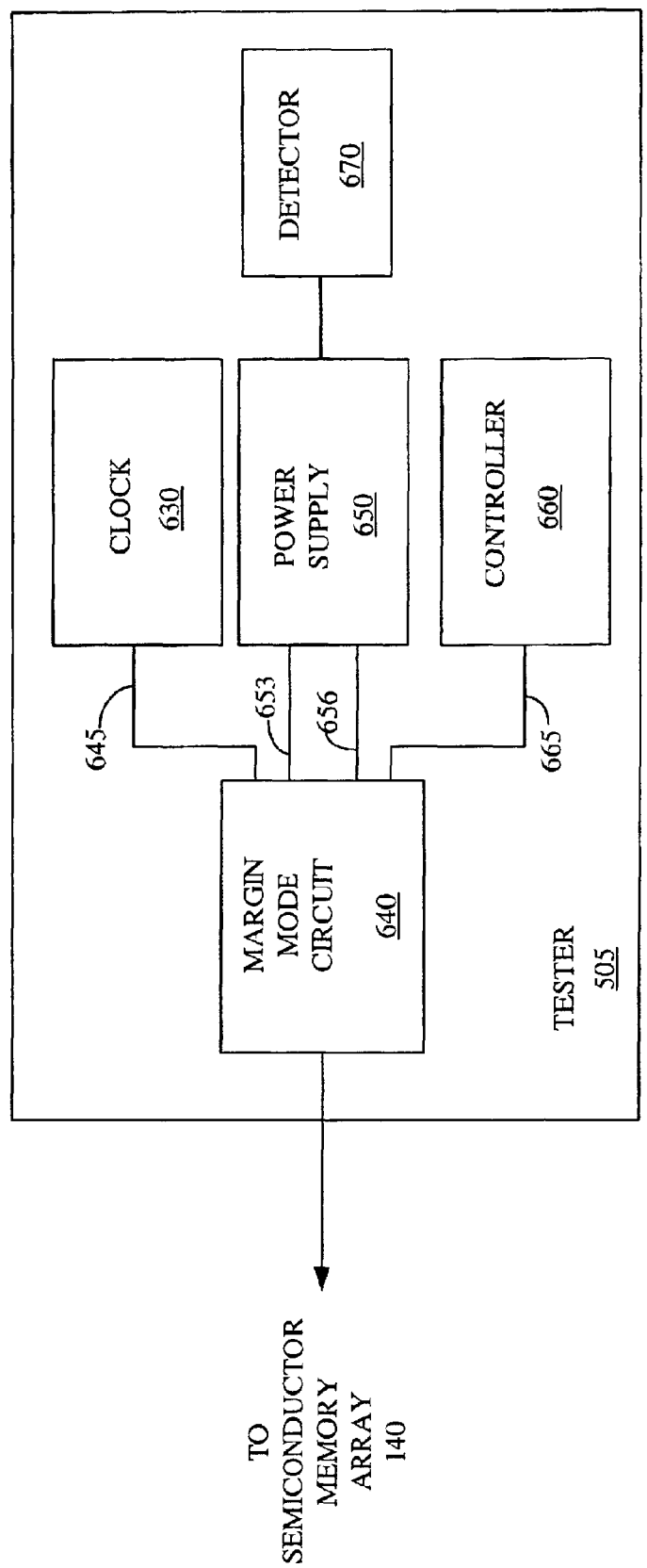
FIG. 6 shows a more detailed block diagram of a tester that may be used in the test circuit shown in FIG. 5, in accordance with one embodiment of the present invention.

FIG. 6 shows a more detailed block diagram of the tester 505. In one embodiment, a clock 630 in the tester 505 may provide a clock signal to a margin mode circuit 640 via a line 645. Electrical power may be provided to the margin mode circuit 640 by a power supply 650 via lines 653 and 656. In one embodiment, the lines 653, 656 may provide a high and a low voltage, respectively. For example, the line 653 may provide the high voltage of about 10 Volts to the margin mode circuit 640 and the line 656 may provide the low voltage of about 3 Volts to the margin mode circuit 640.

The margin mode circuit 640 may use the high voltage provided via the line 653 to provide a voltage $V_{out}$ to the semiconductor memory array 140. The provided voltage $V_{out}$ may be used to test and/or repair the semiconductor memory array 140. The high voltage is traditionally provided to the semiconductor memory array 140 by an outside source (not shown) via at least one transistor (not shown). Thus, the voltage $V_{out}$ provided to the semiconductor memory array 140 may be reduced by the threshold voltage of the one or more transistors (not shown). For example, if the threshold voltage of the transistor is 1 Volt and the high voltage applied to the gate of the transistor is 10 Volts, $V_{out}$ may equal about 9 Volts. However, it may be desirable to provide the entire high voltage to the semiconductor memory array 140. Thus, in accordance with one embodiment of the present invention, substantially all of the high voltage provided via line 653 may be provided to the semiconductor memory array 140 via the margin mode circuit 640, as described in more detail below.

The margin mode circuit 640 may operate in one or more modes, in accordance with one embodiment of the present invention. A controller 660 may be coupled to the margin mode circuit 640 and may provide a variety of signals to the margin mode circuit 640 via an enable line 665. In one embodiment, the controller 660 may provide an enable signal that may be used by the margin mode circuit 640 to provide the high voltage from the line 653 to the semiconductor memory array 140. For example, the controller 660 may provide a logic-low enable signal to the margin mode circuit 640 and the power supply 650 may supply voltages that may range from about 0 Volts to a limiting voltage via the lines 653 and 656. The limiting voltage may be determined by a junction break down voltage that, in one embodiment, may be about 13 Volts. The margin mode circuit 640 may use the logic-low enable signal and the supplied voltages to provide a voltage of up to about the limiting voltage to the semiconductor memory array 140.

If a stringer 410 is present in the semiconductor memory array 140, a DC current may be formed in the power supply 650 when the margin mode circuit 640 is enabled, in accordance with one embodiment of the present invention. For example, the margin mode circuit 640 may use the clock signal from the clock 630 to provide the voltage of about 10 Volts to the word line 510 (see FIG. 5) in the semiconductor memory array 140. If the stringer 410 (see FIG. 5) is coupled to the word line 510, an electrical current may flow from the power supply 650 through the margin mode circuit 640 and be detected by a detector 670 that may be coupled to the power supply 650. In one embodiment, the provided voltage may be high enough to break the stringer 410 and repair the semiconductor memory array 140. For example, a voltage of about 12 Volts may be capable of breaking the stringer 410.

Figure 7A:
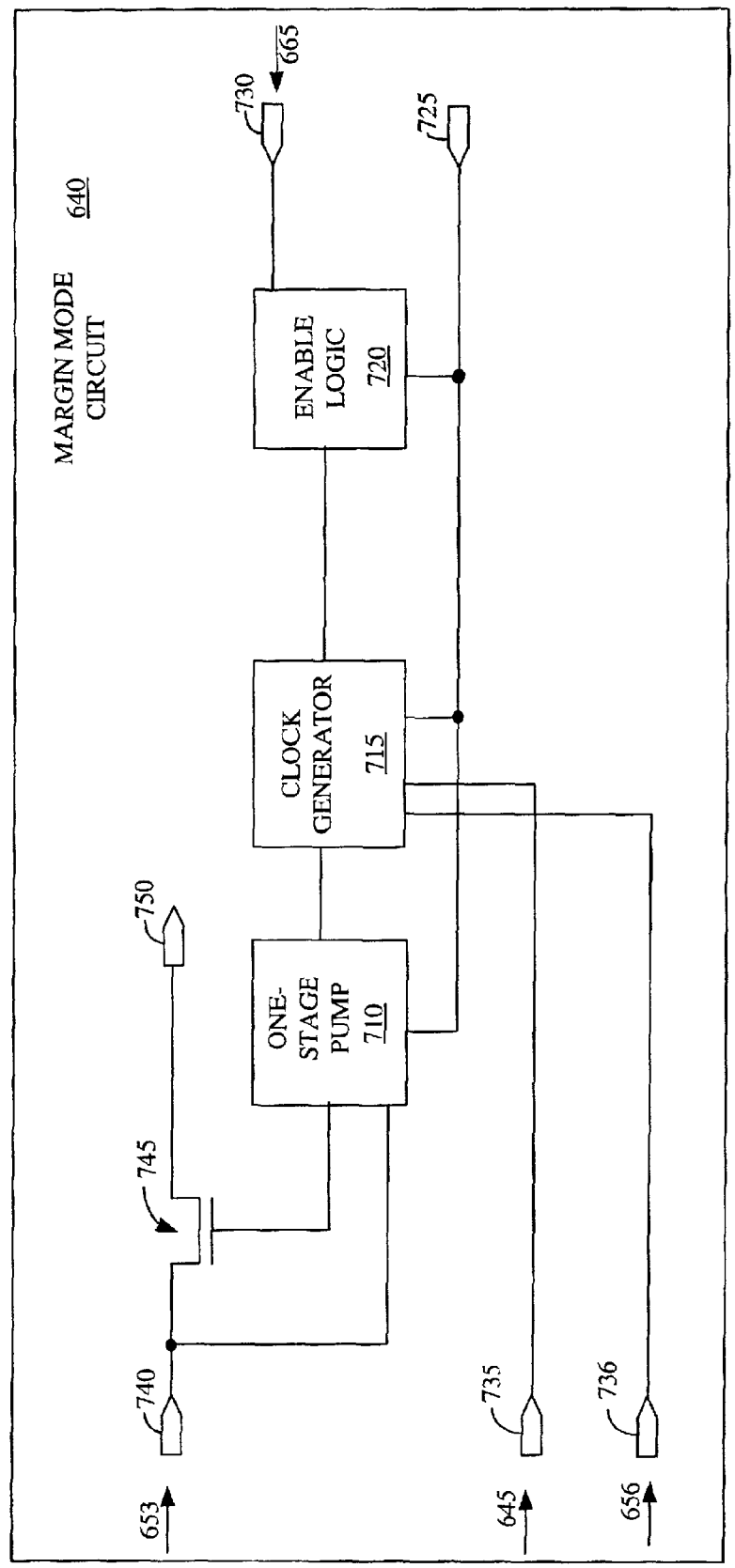
FIGS. 7A–B show block diagrams of two exemplary embodiments of the margin mode circuit that may be used in the test circuit of FIG. 6, in accordance with one embodiment of the present invention.

FIG. 7A shows a block diagram of the margin mode circuit 640, in accordance with one embodiment of the present invention. A one-stage pump 710 may be coupled to a clock generator 715, which may be coupled to an enable logic 720. In one embodiment, a pad 725 may provide a low voltage to the one-stage pump 710, the clock generator 715, and the enable logic 720. For example, the low voltage may be equal to ground, i.e. 0 Volts. A pad 730 may also provide a high voltage to the enable logic 720. For example, the high voltage may be about 3 Volts, which may be in common with the semiconductor memory array 140. A pad 735 may provide the clock generator 715 with an oscillator signal and the enable logic 720 may provide the clock generator 715 with an enable signal. For example, the oscillator signal may be provided to the clock generator 715 via the line 645 and the enable logic 720 may provide a logic-low signal to the clock generator 715. In one embodiment, a pad 736 may provide a high voltage to the clock generator 715. For example, the high voltage may be about 3 Volts.

The enable logic 720 may produce an enable signal. For example, the enable logic 720 may produce a logic-low enable signal using a signal provided by an external logic (not shown). The clock generator 715 may use the enable signal and the oscillator signal to provide a driving signal to the one-stage-pump 710, which may be coupled to a transfer device 745. In one embodiment, the transfer device 745 may be a transistor. A pad 740 may provide a source voltage to the transfer device 745 and to the one-stage pump 710, which may use the driving signal and the source voltage to provide a bias voltage to the gate of the transistor in the transfer device 745 that may forward bias the transfer device 745. For example, if the source voltage is about 12 Volts, the one-stage pump 710 may provide a bias voltage of about 13 Volts to the gate of the transistor in the transfer device 745. By providing the bias voltage to the transfer device 745, the one-stage pump 710 may allow a voltage that is about equal to the source voltage to be provided to a pad 750, in accordance with one embodiment of the present invention.

The pad 750 may be used to couple the margin mode circuit 640, and thus the tester 505, to the semiconductor memory array 140.

Figure 7B:
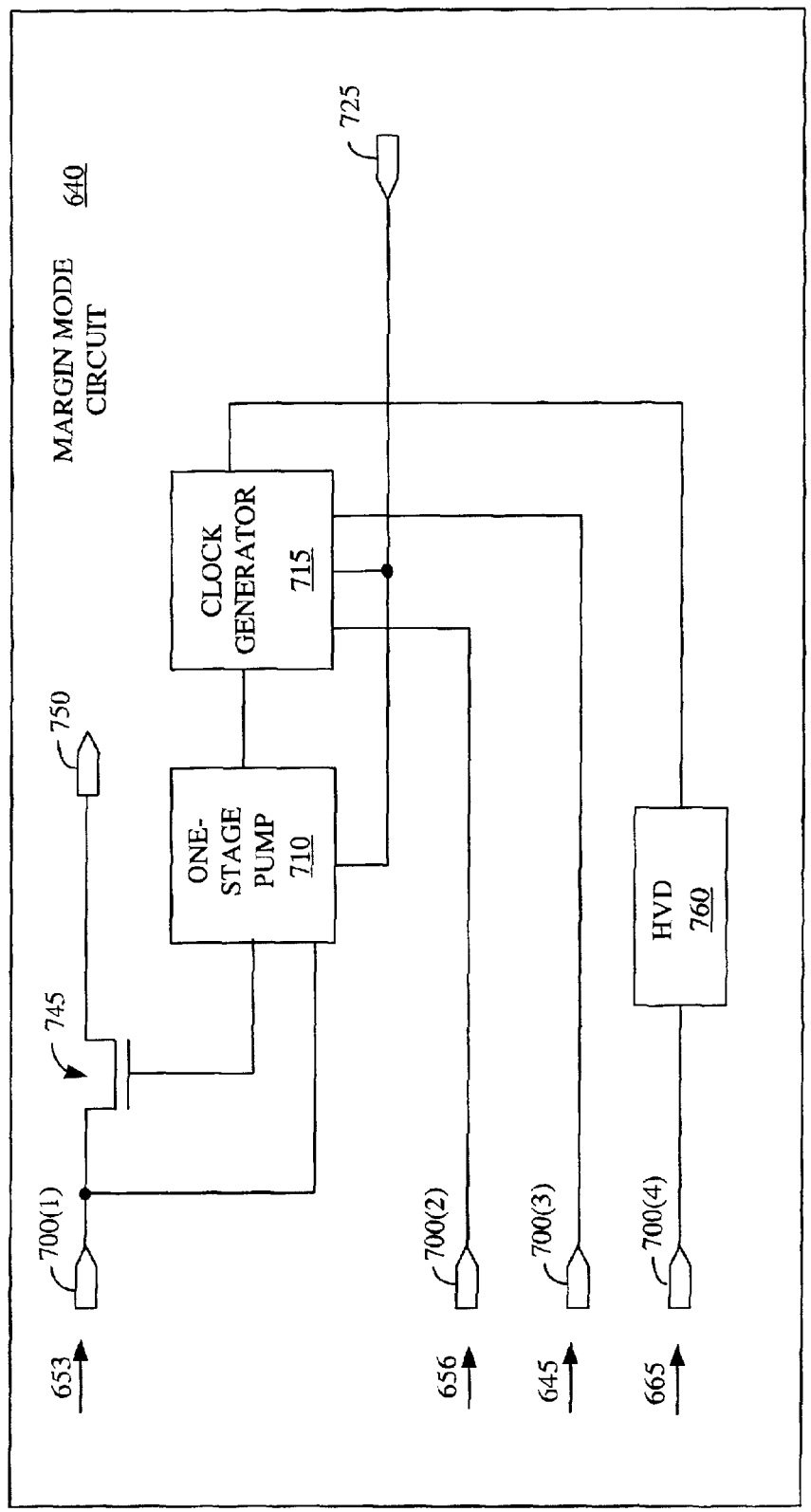

FIG. 7B shows a block diagram of the margin mode circuit 640, in accordance with yet another embodiment of the present invention. In the illustrated embodiment, the margin mode circuit 640 may include a plurality of pads 700(1–4). The pad 700(2) may provide a high voltage to the clock generator 715. For example, the power supply 650 (see FIG. 6) may provide the high voltage of about 3 Volts via the line 656. The pad 700(3) may provide the clock generator 715 with an oscillator signal. For example, the clock 630 (see FIG. 6) may provide the oscillator signal to the clock generator 715 via the line 645. The clock generator 715 may also be coupled to a high voltage detector (HVD) 760, which may be coupled to the pad 700(4). In one embodiment, the pad 700(4) may provide an enabling voltage that is higher than a reference voltage to the HVD 760. For example, the controller 660 (see FIG. 6) may provide the enable signal via the line 665. The HVD 760 may then use the enabling voltage to provide the enable signal to the clock generator 715. For example, the HVD 760 may determine that the enabling voltage may be higher than a reference voltage of 3 Volts and may provide the enable signal to the clock generator 715.

The clock generator 715 may use the enable signal and the oscillator signal to provide a driving signal to the one-stage pump 710. The pad 700(1) may provide a source voltage to a transfer device 745 and to the one-stage pump 710, which may use the driving signal and the source voltage to provide a bias voltage to the gate of the transistor in the transfer device 745 that may forward bias the transistor in the transfer device 745. For example, if the source voltage is about 12 Volts, the one-stage pump 710 may provide a bias voltage of about 13 Volts to the gate of the transistor in the transfer device 745. By providing the bias voltage to the transfer device 745, the one-stage pump 710 may allow a voltage that is about equal to the source voltage to be provided to a node 750, in accordance with one embodiment of the present invention.

Figure 8A:
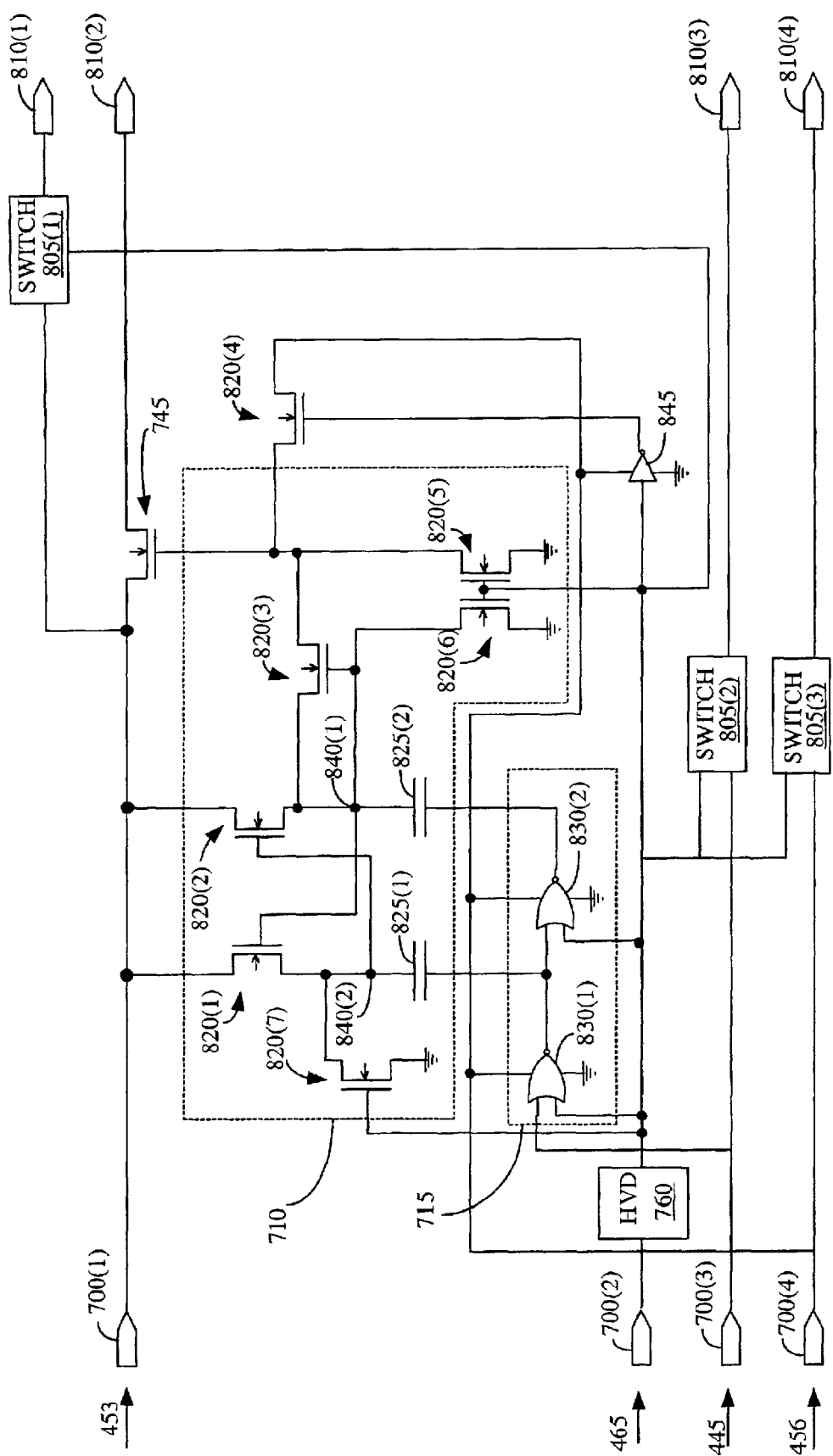
FIGS. 8A–B show circuit diagrams illustrating two exemplary embodiments of the margin mode circuit shown in FIGS. 7A–B, in accordance with one embodiment of the present invention.

FIG. 8A shows a circuit diagram illustrating an exemplary embodiment of the margin mode circuit 640 shown in FIG. 7B, in accordance with one embodiment of the present invention. As described above, the margin mode circuit 640 may include the one-stage pump 710 and the clock generator 715. The one-stage pump 710 may, in one embodiment, include a plurality of transistors 820(1–3), 820(5–7) and a plurality of capacitors 825(1–2). However, it will be appreciated that the present invention is not so limited. In alternative embodiments, the one-stage pump 710 may include more or fewer transistors 820(1–3), 820(5–7), as well as more or fewer capacitors 825(1–2), without departing from the scope of the present invention. Although not so limited, the clock generator 715 may, in one embodiment, include a plurality of logic gates 830(1–2). For example, the clock generator 715 may include two NOR logic gates 830(1–2). However, it will be appreciated that, in alternative embodiments, the clock generator 715 may include more or fewer logic gates 830(1–2) without departing from the scope of the present invention.

As described above, a variety of signals may be provided to the margin mode circuit 640 via the pads 700(1, 3, 4). The pads 700(1, 3, 4) may be coupled to a plurality of switching devices 805(1–3), which may be coupled to a plurality of output pads 810(1), 810(3), 810(4). The form of the switching devices 805(1–3) is a matter of design choice and may take any of a variety of forms well know to those of ordinary skill in the art without departing from the scope of the present invention. For example, the switching devices 805 (1–3) may include a pair of transistors (not shown). The pad 700(1) may also be coupled to the transfer device 745, which may be coupled to the pad 810(2). In one embodiment, the pad 810(2) may be coupled to the semiconductor memory array 140 (see FIG. 1).

The pad 700(2) may provide the enabling voltage to the HVD 760. When the enabling voltage is lower than the reference voltage, the HVD 760 may not provide an enable signal to the margin mode circuit 640. For example, the HVD 760 may provide a logic-high signal. The pads 700(1), 700(3), 700(4) may then be coupled to the output pads 810(1), 810(3), 810(4) by the switching devices 805(1–3). In one embodiment, the logic-high signal may also be used to substantially decouple the tester 505 from the semiconductor memory array 140 (see FIG. 6). For example, a logic-high enable signal may be provided to the NOR logic gates 830(1–2) so that the output of the NOR logic gates 830(1–2) may be asserted to logic-low. The logic-high enable signal may also be provided to the gates of the transistors 820(6–7) so that the transistors 820(6–7) may become conductive and couple the capacitors 825(1–2) to ground, substantially discharging the capacitors 825(1–2). The logic-high enable signal may also be provided to the gate of the transistor 820(5) such that the transistor 820(5) may become substantially conductive and the gate of the transistor in the transfer device 745 may be coupled to ground. Consequently, the transistor in the transfer device 745 may become substantially non-conductive and the input pad 700(1) may be substantially decoupled from the output pad 810(2) and the semiconductor memory array 140. The electric current present in the tester 505 is therefore reduced to about zero.

When the enabling voltage is higher than the reference voltage to the HVD 760, the HVD 760 may provide an enable signal to the margin mode circuit 640, in accordance with one embodiment of the present invention. For example, the HVD 760 may provide a logic-low signal. When the margin mode circuit 640 is enabled, the pads 700(1), 700(3), 700(4) may then be decoupled from the output pads 810(1), 810(3), 810(4) by the switching devices 805(1–3). In one embodiment, the pad 700(1) may then provide the source voltage to the transfer device 745 and the one-stage pump 710. The pad 700(2) may provide the high voltage to the HVD 760, which may provide a logic-low signal to the clock generator 715. The pad 700(3) may provide the clock generator 715 with the oscillator signal. The pad 700(4) may be coupled to the clock generator 715 and may provide the supply voltage of about 3 Volts.

As described in more detail below, when the margin mode circuit 640 is enabled and the source voltage is larger than the reference voltage minus the threshold voltage, the transistor 820(3) is forward-biased and provides an electrically conductive connection between a node 840(1) of the one-stage pump 710 and the transfer device 745. The one-stage pump 710 may then provide a forward-biasing voltage to the transfer device 745 that may allow the transfer device 745 to form an electrically conductive connection between the pad 700(1) and the output pad 810(2) such that the source voltage may be provided to the output pad 810(2).

However, if the margin mode circuit 640 is enabled and the source voltage is smaller than the reference voltage minus the threshold voltage, the one-stage pump 710 may not be capable of providing a forward-biasing voltage to the transfer device 745. Accordingly, the pad 700(4) may also be coupled to the drain of a transistor 820(4) and the HVD 760 may be coupled to an inverter 845, which may be coupled to the gate of the transistor 820(4). The logic-low enable signal from the HVD 760 may be used to forward-bias the transistor 820(4) and, when the source voltage is smaller than the reference voltage minus the threshold voltage, to forward-bias the transfer device 745 to form an electrically conductive connection between the pad 700(1) and the output pad 810(2) such that the source voltage may be provided to the output pad 810(2).

Figure 8B:
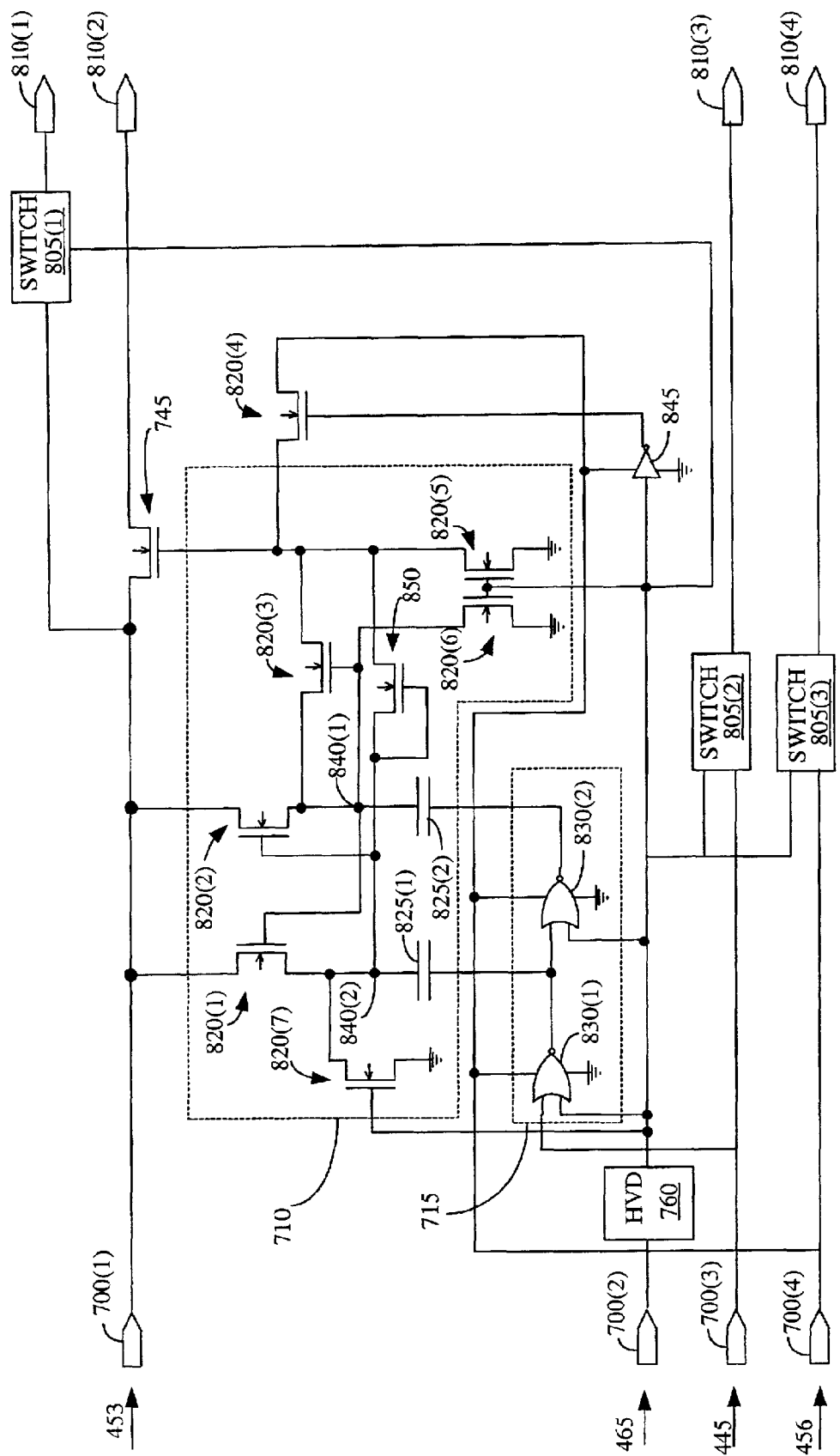

FIG. 8B shows a circuit diagram illustrating an alternative exemplary embodiment of the margin mode circuit 640 shown in FIG. 7. The illustrated embodiment includes a transistor 850. Both the source and the gate of the transistor 850 are coupled to a node 840(2), such that the transistor 850 functions as a diode. By adding the transistor 850 to the one-stage pump 710, the transfer device 745 may be forward-biased in fewer clock cycles. For example, the one-stage pump 710 may provide a forward-biasing voltage to the transfer device 745 in about one-half the number of clock cycles as would be used in the absence of the transistor 850.

Figure 9:
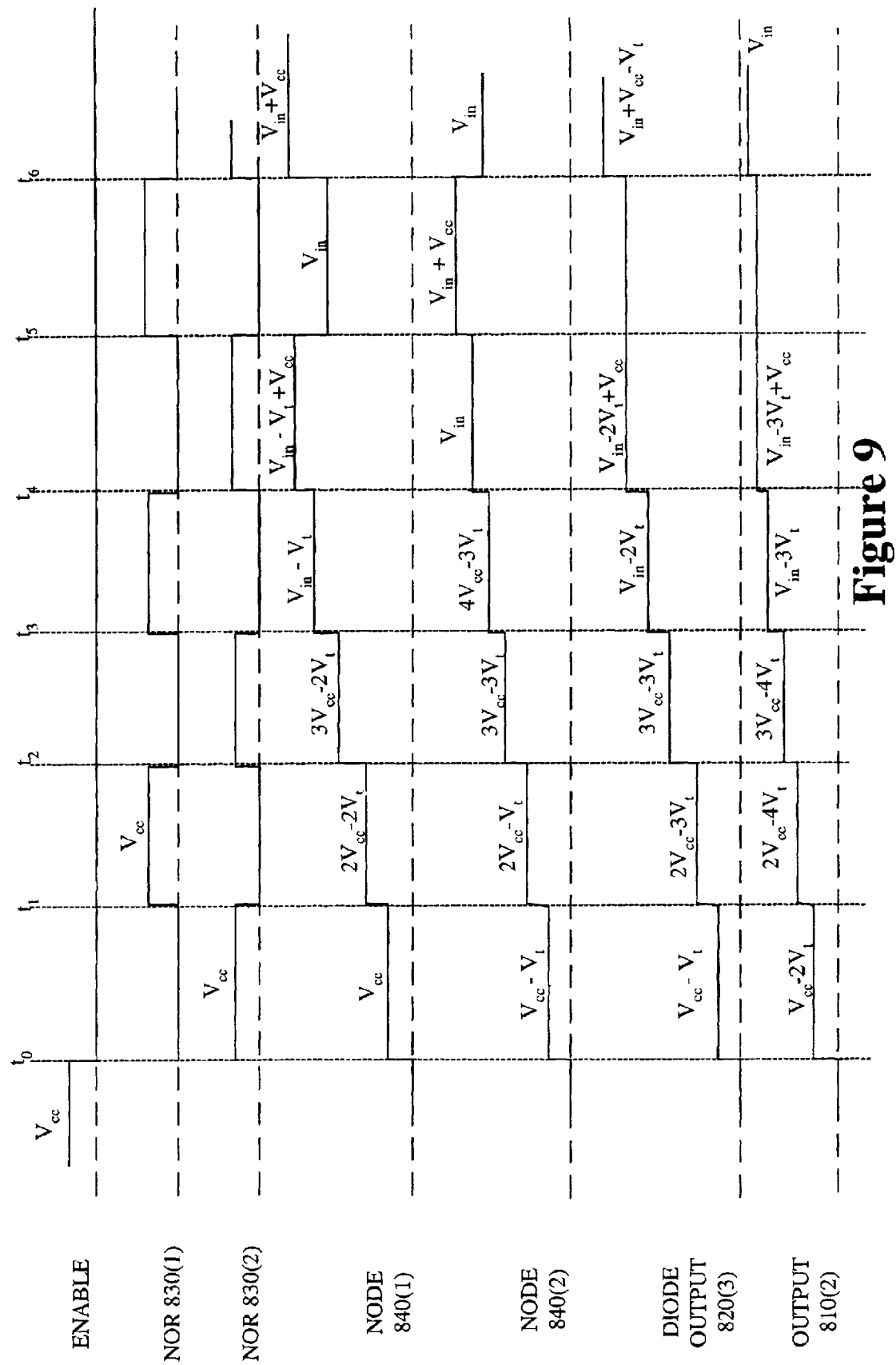
FIG. 9 shows a timing diagram illustrating an exemplary mode of operation of the tester shown in FIG. 5, in accordance with one embodiment of the present invention.

FIG. 9 shows a timing diagram illustrating an exemplary mode of operation of the tester 505, in accordance with one embodiment of the present invention. As previously discussed, when the source voltage is less than the reference voltage minus the threshold voltage, the enable signal may be used by the transistor 820(4) to provide an electrically conductive connection between the pad 700(1) and the output pad 810(2) such that the source voltage may be provided to the output pad 810(2). In the following discussion, it is assumed that the source voltage is larger than the reference voltage minus the threshold voltage. Furthermore, in FIG. 9, the reference voltage is indicated by $V_{cc}$, the source voltage is indicated by $V_{in}$, and the threshold voltage is indicated by $V_t$.

As discussed above, the tester 505 may be enabled by providing the enable voltage, which is higher than the reference voltage, to the pad 700(2) at a time $t_0$. At time $t_0$, the HVD 760 may provide a logic-low enable signal to the clock generator 715. A logic-high clock signal of $V_{cc}$ may also be provided at the time $t_0$ and the NOR logic gate 830(1) may use the logic-low enable signal and logic-high clock signal to assert a logic-low signal, which may be provided to the NOR logic gate 830(2). The NOR logic gate 830(2) may use the asserted logic-low signal and the logic-low enable signal to assert a logic-high signal to the capacitor 825(2) at a time $t_0$. For example, the NOR logic gate 830(2) may provide the voltage $V_{cc}$ of about 3 Volts to the capacitor 825(2).

The capacitor 825(2) may be substantially discharged at the time to and thus the capacitor 825(2) may provide the voltage $V_{cc}$ to a node 840(1) that may be coupled to the gate of the transistor 820(1), as shown in FIG. 8A. In one embodiment, the input pad 700(1) may provide the input voltage $V_{in}$ to the drain of the transistors 820(1–2). The NOR logic gate 830(2) may provide a voltage of $V_{cc}$ to the node 840(1), which will provide a voltage of $V_{cc}-V_t$ to the node 840(2) via the transistor 820(1) and to the output of the diode 820(3). A voltage of $V_{cc}-2V_t$ may then be provided to the output pad 810(2).

At a time $t_1$, the clock signal may oscillate to logic-low, the NOR logic gate 830(1) may assert a logic-high signal, and the NOR logic gate 830(2) may assert a logic-low signal. The node 840(1) may be provided with a voltage of $2V_{cc}-2V_t$ and the node 840(2) may be provided with a voltage of $2V_{cc}-V_t$. A voltage of $2V_{cc}-3V_t$ may then be provided to the output of the diode 820(3), which may not be sufficient to allow the full voltage $V_{in}$ to be provided from the pad 700(1) to the output pad 810(2). Thus, a voltage of $2V_{cc}-4V_t$ may then be provided to the output pad 810(2).

At a time $t_2$, the clock signal may oscillate to logic-high, the NOR logic gate 830(1) may assert a logic-low signal, and the NOR logic gate 830(2) may assert a logic-high signal. The node 840(1) may be provided with a voltage of $3V_{cc}-2V_t$ and the node 840(2) may be provided with a voltage of $3V_{cc}-3V_t$. A voltage of $3V_{cc}-3V_t$ may then be provided to the output of the diode 820(3), which may not be sufficient to allow the full voltage $V_{in}$ to be provided from the pad 700(1) to the output pad 810(2). Thus, a voltage of $3V_{cc}-4V_t$ may then be provided to the output pad 810(2).

At a time $t_3$, the clock signal may oscillate to logic-low, the NOR logic gate 830(1) may assert a logic-high signal, and the NOR logic gate 830(2) may assert a logic-low signal. The transistor 820(1) may become forward-biased and provide a voltage of about $4V_{cc}-3V_t$ to the node 840(2). The node 840(1) may then be provided with a voltage of $V_{in}-V_t$. A voltage of $V_{in}-2V_t$ may then be provided to the output of the diode 820(3), which may not be sufficient to allow the full voltage $V_{in}$ to be provided from the pad 700(1) to the output pad 810(2). Thus, a voltage of $V_{in}-3V_t$ may be provided to the output pad 810(2).

At a time $t_4$, the clock signal may oscillate to logic-high, the NOR logic gate 830(1) may assert a logic-low signal, and the NOR logic gate 830(2) may assert a logic-high signal. The transistor 820(1) may be forward-biased and provide a voltage of about $V_{in}$ to the node 840(2). The node 840(1) may then be provided with a voltage of $V_{in}-V_t+V_{cc}$. A voltage of $V_{in}-2V_t+V_{cc}$ may then be provided to the output of the diode 820(3), which may not be sufficient to allow the full voltage $V_{in}$ to be provided from the pad 700(1) to the output pad 810(2). Thus, a voltage of $V_{in}-3V_t+V_{cc}$ may be provided to the output pad 810(2).

At a time $t_5$, the clock signal may oscillate to logic-low, the NOR logic gate 830(1) may assert a logic-high signal, and the NOR logic gate 830(2) may assert a logic-low signal. The node 840(2) may be pumped to a voltage of $V_{in}+V_{cc}$. The transistor 820(2) may become forward-biased and the node 840(1) may then be provided with a voltage of $V_{in}$. A voltage of $V_{in}-2V_t+V_{cc}$ may then be provided to the output of the diode 820(3), which may not be sufficient to allow the full voltage $V_{in}$ to be provided from the pad 700(1) to the output pad 810(2). Thus, a voltage of $V_{in}-3V_t+V_{cc}$ may be provided to the output pad 810(2).

At a time $t_6$, the clock signal may oscillate to logic-high, the NOR logic gate 830(1) may assert a logic-low signal, and the NOR logic gate 830(2) may assert a logic-high signal. The node 840(2) may be provided with a voltage of $V_{in}$ and the node 840(1) may then be provided with a voltage of $V_{in}+V_{cc}$. A voltage of $V_{in}-V_t+V_{cc}$ may then be provided to the output of the diode 820(3), which may be sufficient to allow the full voltage $V_{in}$ to be provided from the pad 700(1) to the output pad 810(2). Thus, a voltage of $V_{in}$ may be provided to the output pad 810(2).

The above described mode of operation of the one-stage pump 710 may continue for any desirable amount of time. Thus, by using a variety of voltages $V_{in}$, the tester 505 may provide a variety of voltages to the semiconductor memory array 140 by using a one-stage pump 710, which may occupy less area and may use smaller clock generators 715. In particular, the tester 505 may be capable of providing a voltage to test and/or repair the semiconductor memory array 140. The tester 505 may also be useful in deep-power-down mode. At such a time as it may become desirable to measure the current in the semiconductor memory array 140 while the semiconductor memory array 140 is in deep-power-down mode, the tester 505 may use a separate power supply 650 and thus may be capable of monitoring the currents in the semiconductor memory array 140 during deep-power-down mode, as described above.

Although the various logic transitions have been described above as occurring at substantially the same time, it will be appreciated by those of ordinary skill in the art that such logic transitions may not occur substantially simultaneously. For example, time delays may be introduced as the signals propagate through the circuit. For another example, transient behavior of the components of the one-stage pump 710 may make it desirable to allow for time delays so that the various components may reach a relatively stable state. It will be appreciated that said time delays are within the scope of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
   a one-stage pump adapted to access a first voltage and provide a second voltage using the first voltage; and
   a transfer device capable of providing the first voltage to a node using the second voltage.

2. The apparatus of claim 1, wherein the one-stage pump is adapted to access an enable signal.

3. The apparatus of claim 2, further comprising a transistor coupled to an inverter adapted to access the enable signal, wherein the transistor is adapted to provide a low bias voltage to the transfer device in response to the enable signal.

4. The apparatus of claim 2, further comprising a clock generator, wherein the one-stage pump is adapted to access a first clock signal provided by the clock generator.

5. The apparatus of claim 4, wherein the clock generator comprises:
   a first logic gate adapted to provide a second clock signal using the first clock signal and the enable signal; and
   a second logic gate adapted to provide a third clock signal using the second clock signal and the enable signal, wherein the third clock signal is substantially inverted relative to the second clock signal.

6. The apparatus of claim 5, wherein the one-stage pump comprises:
   a first node between a first capacitor and a first transistor, wherein the first capacitor is coupled to the first logic gate and the first transistor is adapted to access the first voltage;
   a second node between a second capacitor and a second transistor, wherein the second capacitor is coupled to the second logic gate and the second transistor is adapted to access the first voltage; and
   a first diode adapted to provide the second voltage to the transfer device using a third voltage provided to the second node by the first and second capacitor and the first and second transistor.

7. The apparatus of claim 6, wherein the first node is coupled to a gate of the second transistor.

8. The apparatus of claim 7, wherein the second node is coupled to a gate of the first transistor.

9. The apparatus of claim 6, wherein the diode is a third transistor, a drain and a gate of the third transistor being coupled to the second node.

10. The apparatus of claim 6, wherein the transfer device is a fourth transistor.

11. The apparatus of claim 10, wherein the first voltage is provided to a drain of the fourth transistor.

12. The apparatus of claim 11, wherein the second voltage is provided to a gate of the fourth transistor.

13. The apparatus of claim 6, further comprising a second diode adapted to provide the second voltage to the transfer device using a fourth voltage provided to the first node by the first and second capacitors and the first and second transistors.

14. The apparatus of claim 1, wherein the first voltage is smaller than the second voltage.

15. The apparatus of claim 1, wherein the first voltage is provided to a semiconductor memory array.

16. An apparatus, comprising:
a first and a second transistor adapted to access a first voltage;
a first logic gate adapted to provide a second clock signal to a first capacitor using a first clock signal and an enable signal;
a second logic gate adapted to provide a third clock signal to a second capacitor using the second clock signal and the enable signal, wherein the third clock signal is substantially inverted relative to the second clock signal;
a first node between the first capacitor and the first transistor, wherein the first node is coupled to a gate of the second transistor;
a second node between the second capacitor and the second transistor, wherein the second node is coupled to a gate of the first transistor;
a first transfer device adapted to provide a second voltage using a third voltage provided to the second node by the first and second capacitors and the first and second transistors; and
a second transfer device coupled to the first transfer device, wherein the second transfer device is capable of providing the first voltage to a third node using the second voltage.

17. The apparatus of claim 16, wherein the first and second logic gates are NOR logic gates.

18. The apparatus of claim 16, wherein the first transfer device is a diode.

19. The apparatus of claim 18, wherein the diode is a transistor which has a gate and a drain coupled to the second node.

20. The apparatus of claim 16, wherein the third node is coupled to a semiconductor memory array.

21. A method, comprising:
providing a first voltage to a one-stage pump;
providing a second voltage to a first transfer device using the one-stage pump; and
providing the first voltage to a node coupled to the first transfer device using the second voltage.

22. The method of claim 21, wherein accessing the first voltage comprises accessing the first voltage in response to an enable signal.

23. The method of claim 21, wherein providing the second voltage comprises providing the second voltage using a first clock signal.

24. The method of claim 23, wherein using the first clock signal comprises providing a second and a third clock signal in response to the first clock signal, the third clock signal being substantially inverted relative to the second clock signal.

25. The method of claim 24, wherein providing the second and the third clock signal comprises providing the second clock signal to a first capacitor and a first transistor and providing the third clock signal to a second capacitor and a second transistor, the first and the second transistor being coupled to the first voltage.

26. The method of claim 25, wherein providing the second voltage using the first voltage comprises providing a third voltage to a second transfer device, the first transistor, the second capacitor, and the second transistor using the second and third clock signal.

27. The method of claim 26, wherein providing the third voltage to the second transfer device comprises providing the third voltage to a diode.

28. The method of claim 26, wherein providing the second voltage to the first transfer device comprises providing the second voltage to the first transfer device using the third voltage provided to the second transfer device.

29. The method of claim 21, wherein providing the first voltage to the node comprises providing the first voltage to the node coupled to a semiconductor memory array.

30. An apparatus, comprising:
means for providing a first voltage to a one-stage pump;
means for providing a second voltage using the first voltage supplied to the one-stage pump, wherein the second voltage is larger than the first voltage; and
means for providing the first voltage to a node using the second voltage.

31. The apparatus of claim 30, wherein the means for providing the second voltage comprises means for providing a first clock signal and a second clock signal to the one-stage.

32. The apparatus of claim 31, wherein the means for providing the first clock signal and the second clock signal comprises:
means for providing an enable signal;
means for providing a third clock signal;
means for providing the first clock signal to the one-stage pump using the third clock signal and the enable signal; and
means for providing the second clock signal to the one-stage pump using the clock signal and the enable signal.

33. A system, comprising:
a power supply capable of providing a first voltage;
a clock capable of providing a first clock signal;
a margin mode circuit coupled to the power supply and the clock, wherein the margin mode circuit is adapted to provide the first voltage to a test device using the clock signal; and
a controller coupled to the margin mode circuit, wherein the controller is adapted to detect a current produced in the margin mode circuit by the test device in response to the first voltage.

34. The system of claim 33, wherein the controller is further adapted to provide an enable signal to the margin mode circuit.

35. The system of claim 34, wherein the margin mode circuit is further adapted to provide the first voltage in response to the enable signal.

36. The system of claim 35, wherein the margin mode circuit comprises:
  a first and a second transistor adapted to access the first voltage;
  a first NOR logic gate adapted to provide a second clock signal to a first capacitor using the first clock signal and the enable signal;
  a second NOR logic gate adapted to provide a third clock signal to a second capacitor using the second clock signal and the enable signal, wherein the third clock signal is substantially inverted relative to the second clock signal;
  a first node between the first capacitor and the first transistor, wherein the first node is coupled to a gate of the second transistor;
  a second node between the second capacitor and the second transistor, wherein the second node is coupled to a gate of the first transistor;
  a first transfer device adapted to provide a second voltage using a third voltage provided to the second node by the first and second capacitor and the first and second transistor; and
  a second transfer device coupled to the first transfer device, wherein the second transfer device is capable of providing the first voltage to the test device using the second voltage.

37. An apparatus in a memory circuit for testing a semiconductor memory array, comprising:
  a power supply adapted to provide a first and a second voltage, wherein the first voltage is larger than the second voltage;
  a clock generator adapted to provide a first clock signal;
  a controller adapted to provide an enable signal;
  a margin mode circuit coupled to the power supply, the clock, and the controller, wherein the margin mode circuit is adapted to provide the first voltage to a test device using the clock signal and the second voltage in response to receiving the enable signal; and
  a detector coupled to the margin mode circuit, wherein the detector is adapted to detect a current produced in the margin mode circuit by the semiconductor memory array in response to the first voltage.

38. An apparatus in a memory circuit for testing a semiconductor memory array, comprising:
  an enable logic coupled to a first pad, wherein the enable logic is adapted to access a first voltage provided by the first pad and provide at least one of an enable signal and a disable signal in response to the first voltage;
  a clock generator coupled to a second pad, a third pad, and the enable logic, wherein the clock generator is adapted to provide a clock signal in response to detecting the enable signal using a signal provided by the second pad and a second voltage provided by the third pad;
  a one-stage pump coupled to a fourth pad and the clock generator, wherein the one-stage pump is adapted to provide a fourth voltage using the clock signal and a third voltage provided by the fourth pad;
  a transfer device coupled to the fourth pad, the one-stage pump, and the semiconductor memory array, wherein the transfer device is adapted to provide the third voltage to the semiconductor memory array using the fourth voltage.

39. The apparatus of claim 38, wherein the enable logic is a high voltage detector.

40. The apparatus of claim 38, further comprising a plurality of switches coupled to the enable logic and the first, the third, and the fourth pads, wherein the switches are adapted to decouple the first, the third, and the fourth pads from the enable logic, the clock generator, the one-stage pump, and the transfer device in response to detecting the disable signal.

41. The apparatus of claim 40, wherein the switches are adapted to couple the first, the third, and the fourth pads to the memory circuit in response to detecting the disable signal.

* * * * *